United States Patent [19]

Morimoto et al.

[11] Patent Number: 5,087,587
[45] Date of Patent: Feb. 11, 1992

[54] EPITAXIAL GROWTH PROCESS FOR THE PRODUCTION OF A WINDOW SEMICONDUCTOR LASER

[75] Inventors: Taiji Morimoto, Nara; Shigeki Maei, Tenri; Hiroshi Hayashi, Kyoto; Saburo Yamamoto, Nara, all of Japan

[73] Assignee: Sharp Kabushiki Kaisha, Osaka, Japan

[21] Appl. No.: 12,249

[22] Filed: Feb. 9, 1987

[30] Foreign Application Priority Data

Feb. 13, 1986 [JP] Japan .................................. 61-31646
Feb. 17, 1986 [JP] Japan .................................. 61-33146

[51] Int. Cl.$^5$ ............................................. H01L 21/20
[52] U.S. Cl. ............................ 437/129; 148/DIG. 95; 437/133; 437/970
[58] Field of Search .......................... 156/621, 624; 148/DIG. 29, 66, 72, 74, 95, 101, 108, 134, 168; 357/16, 17, 55, 56, 60; 437/92, 120, 121, 122, 129, 130, 133, 970; 372/45, 46, 48, 49

[56] References Cited

U.S. PATENT DOCUMENTS

| | | | |
|---|---|---|---|
| 4,166,253 | 8/1979 | Small et al. | 357/18 |
| 4,185,256 | 1/1980 | Scifres et al. | 437/129 |
| 4,215,319 | 7/1980 | Botez | 437/129 |
| 4,347,486 | 8/1982 | Botez | 372/46 |
| 4,385,389 | 5/1983 | Botez | 372/48 |
| 4,523,317 | 6/1985 | Botez | 372/48 |
| 4,547,396 | 10/1985 | Botez et al. | 437/129 |
| 4,569,054 | 2/1986 | Connolly et al. | 372/45 |
| 4,594,718 | 6/1986 | Scifres et al. | 372/45 |
| 4,594,719 | 6/1986 | Ackley | 372/48 |
| 4,631,729 | 12/1986 | Goodwin et al. | 372/48 |
| 4,633,477 | 12/1986 | Morrison et al. | 357/17 |
| 4,642,143 | 2/1987 | Connolly et al. | 437/129 |

FOREIGN PATENT DOCUMENTS

| | | | |
|---|---|---|---|
| 0081956 | 3/1982 | European Pat. Off. | |
| 095826 | 12/1983 | European Pat. Off. | |
| 155853 | 9/1985 | European Pat. Off. | |
| 199588 | 10/1986 | European Pat. Off. | |
| 0033080 | 3/1978 | Japan | 437/129 |
| 0067679 | 4/1984 | Japan | 372/45 |
| 0092591 | 5/1984 | Japan | 372/48 |
| 0127890 | 7/1984 | Japan | 437/129 |
| 60-37191 | 2/1985 | Japan | |

*Primary Examiner*—Robert Kunemund
*Assistant Examiner*—William Bunch
*Attorney, Agent, or Firm*—Morrison & Foerster

[57] ABSTRACT

A window semiconductor laser device comprising a stripe-channeled substrate, an active layer for laser oscillation and a cladding layer disposed under the active layer, wherein the surface of the active layer is flat and the thickness of the portion of the active layer corresponding to the striped channel of said substrate in each of the window regions in the vicinity of the facets is thinner than that of the portion of the active corresponding to the striped channel of said substrate in the stimulated region positioned between the window regions.

1 Claim, 6 Drawing Sheets

EPITAXIAL GROWTH PROCESS FOR THE PRODUCTION OF A WINDOW SEMICONDUCTOR LASER

BACKGROUND OF THE INVENTION

1. Field of the invention

This invention relates to a novel semiconductor laser device having window regions in which the absorption of laser light is suppressed and an epitaxial growth process for the production of the semiconductor by which the thickness of the grown layer can be controlled.

2. Description of the Prior Art

In order to achieve continuously stable laser oscillation in a single mode at a low threshold current level, semiconductor laser devices have been designed in a manner to define the active layer by cladding layers, and moreover to confine light and carriers with a high density within the laser oscillation area of the active layer by means of a current-confining striped structure and a waveguide structure. However, when the semiconductor laser devices operate at a high output power, the density of light in the active layer is increased, resulting in heat deterioration of the laser devices. To resolve this problem, TRS (a high-power, single-mode laser with a twin-ridge-substrate structure) lasers have been proposed (Appl. Phys. Lett., vol. 42, No. 10, 15th May, 1983, p. 853) in which a thin active layer is formed to decrease the light density of the active layer thereby attaining high output power operation. The thin active layer is grown on the ridges of the base layer by liquid phase epitaxy so as to control the thickness thereof. However, even though a thin active layer is grown on the ridges of the base layer and accordingly a decrease in the light density thereof is achieved, the absorption of laser light at or near the facets does not decrease, causing damage and/or deterioration of the facets, which shortens the life of these TRS lasers.

In general, as a crystal growth process by which a crystal layer with a nonuniform thickness in the direction from one end to the other end of the surface of a semiconductor substrate is grown on the substrate by liquid phase epitaxy, there is a process in which a mesa is formed on a semiconductor substrate and a crystal layer is grown on the substrate. However, when the height of the mesa is not sufficiently smaller than the thickness of the epitaxially grown layer, the thin portion of the epitaxially grown layer corresponding to the mesa cannot be formed into a flat-shape but it is formed into a convexed shape, which causes difficulty in the control of the thickness of the portion of the succeeding layer epitaxially grown on the said convexed portion so that the thickness of the said portion of the layer becomes thinner than that of the other portion of the layer. On the other hand, when the height of the mesa is sufficiently smaller than the thickness of the epitaxially grown layer, the whole surface of the grown layer becomes flat, so that the thickness of the succeeding layer becomes uniform over the whole area thereof regardless of the mesa of the substrate, which causes difficulty in the epitaxial growth of a crystal layer with a uniform thickness. Thus, semiconductor laser devices with a multi-layered structure having different layer thicknesses cannot be provided even though a conventional epitaxial growth process for the production of semiconductor laser devices is employed with liquid phase epitaxy.

SUMMARY OF THE INVENTION

The semiconductor laser device of this invention, which overcomes the above-discussed and numerous other disadvantages and deficiencies of the prior art, comprises a stripe-channeled substrate, an active layer for laser oscillation and a cladding layer disposed under the active layer, wherein the surface of the active layer is flat and the thickness of the portion of the active layer corresponding to the striped channel of said substrate in each of the window regions in the vicinity of the facets is thinner than that of the portion of the active layer corresponding to the striped channel of said substrate in the stimulated region positioned between the window regions.

In a preferred embodiment, a pair of substriped channels are disposed in a parallel manner under the active layer outside of the striped channel of said substrate and the surface of the portion of said cladding layer positioned between the sub-striped channels is in a concaved shape.

The epitaxial growth process for the production of a semiconductor laser device of this invention comprises forming striped channels, which face each other in a parallel manner, on the growth surface of a substrate by an etching technique and growing a crystal layer on the substrate by liquid phase epitaxy, whereby the growth rate of the portion of the crystal layer in one area positioned between or surrounded by said striped channels is controlled and the thickness of the portion of the epitaxially grown layer in said one area positioned between or surrounded by said striped channels is thinner than that of the portions of the epitaxially grown layer in the other area outside of said one area.

Thus, the invention described herein makes possible the objects of (1) providing a long life semiconductor laser device having window regions in which the absorption of laser light is suppressed thereby attaining laser oscillation at a high output power, resulting in high output power operation; (2) providing a semiconductor laser device in which the active layer of the laser oscillation operation area is flat and the thickness of the flat active layer in each of the window regions is thinner than that of the flat active layer in the stimulated region, so that the absorption of laser light at or near the facets can be suppressed, thereby attaining continuous laser oscillation at a high output power; (3) providing a semiconductor laser device which is produced at an improved yield; (4) providing an epitaxial growth process using liquid phase epitaxy by which the thickness of the specified portion of an epitaxially grown layer can be controlled; and (5) providing an epitaxial growth process using liquid phase epitaxy by which the production conditions of a semiconductor laser device can be selected from a wide range, which makes possible the production of a novel semiconductor laser device.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Example 1

This example provides an epitaxial growth process comprising the step of forming striped channels on both sides of or around the area where the epitaxial growth of or a crystal layer is required, whereby the growth rate of the crystal layer in the region positioned between or inside the striped channels can be controlled, resulting in a controlled thickness of the epitaxially grown layer in the said area.

Figure 1:
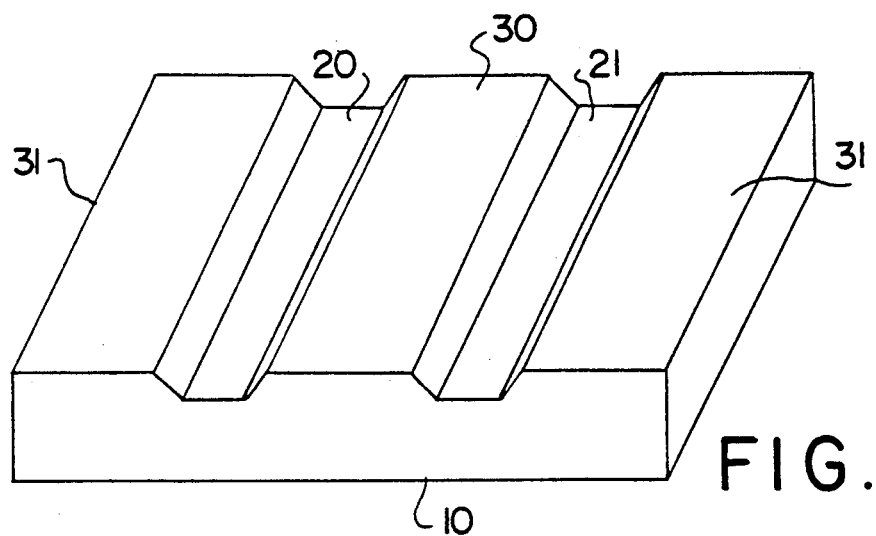
FIG. 1 is a perspective view showing a semiconductor substrate used for the epitaxial growth process in this invention.
Figure 2:
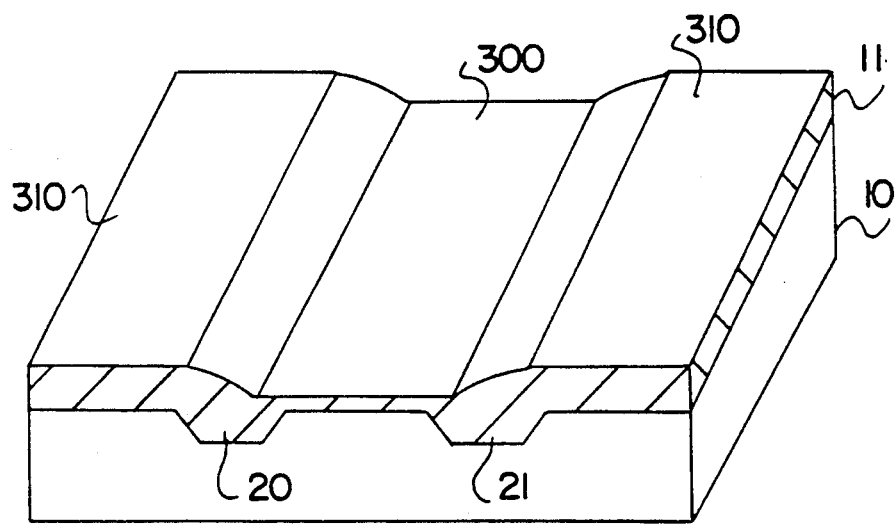
FIG. 2 is a perspective view showing the semiconductor substrate shown in FIG. 2 on which a crystal layer is epitaxially grown

FIG. 1 shows a semiconductor substrate 10 to be used for the epitaxial growth process of this invention, in which two striped channels 20 and 21 having a width of 10 μm and a depth of 1 μm are formed on the surface of the substrate 10 in a parallel manner with a distance of 40 μm from the center of one channel to that of the other channel by a photoetching technique, etc. The phenomenon is observed that when a crystal layer is grown on the semiconductor substrate 10 by liquid phase epitaxy, the growth rate of the layer grown on the curved or concaved portions (i.e., the striped channels 20 and 21) of the substrate 10 is higher than that of the layer grown on the flat portion of the substrate 10. This is why As in the growth solution which comes into contact with the concaved portions (i.e., the striped channels 20 and 21) of the substrate 10 is more quickly consumed for the epitaxial growth of the crystal layer than that in the solution in the surroundings of the concaved portions 20 and 21 of the substrate 10, resulting in the diffusion of As from the solution in the surrounding portions of the substrate 10 into that in the concaved portions 20 and 21 of the substrate 10, causing a decrease in the concentration of As in the surroundings of concaved portions 20 and 21. Accordingly, the epitaxial growth rate of the crystal layer in the surroundings of the concaved portions 20 and 21 of the substrate 10 is suppressed. Therefore, as shown in FIG. 2, the epitaxial growth rate of the crystal layer in the flat portion 30 located between the striped channels 20 and 21 is effectively suppressed due to the striped channels 20 and 21, so that the thickness of the crystal layer 11 in the central area 300 thereof corresponding to the flat portion 30 of the substrate 10 positioned between the striped channels 20 and 21 becomes thinner than that of the crystal layer 11 in the surroundings 310 thereof corresponding to the portions 31 of the substrate 10 outside of the striped channels 20 and 21. The thickness of the central area 300 and the surroundings 310 of the crystal layer 11 were 0.2 μm and 0.6 μm, respectively. The surface of each of the areas 300 and 310 of the crystal layer 11 was formed in a flat-shape.

Figure 3:
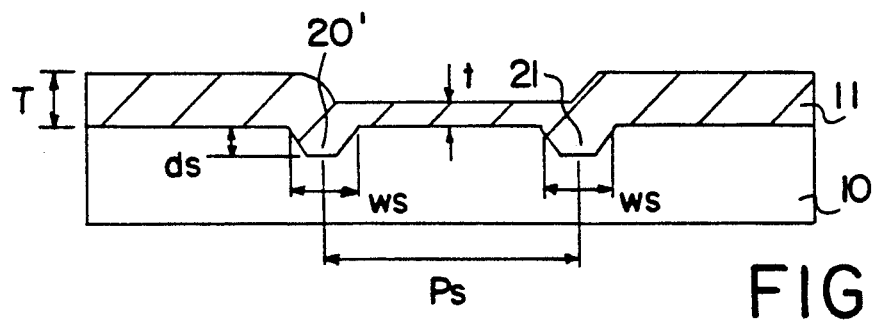
FIG. 3 is a sectional side view showing the semiconductor substrate having the epitaxially grown layer thereon shown in FIG. 2
Figure 4A:
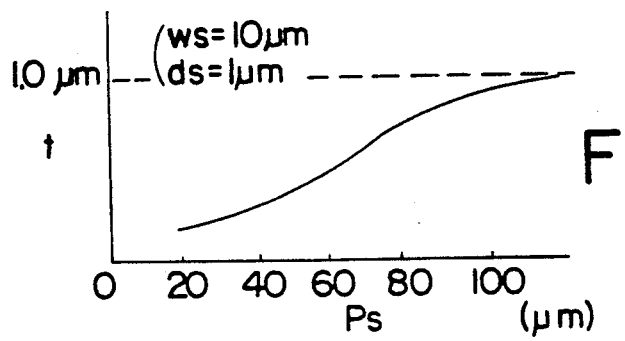
FIGS. 4(A) to 4(C), respectively, show graphs illustrating the relationship between the channel distance Ps and the layer thickness t, the relationship between the channel width Ws and the layer thickness t, and the relationship between the channel depth ds and the layer thickness t.
Figure 4B:
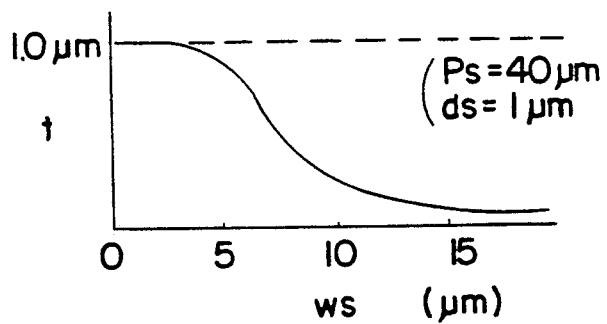
Figure 4C:
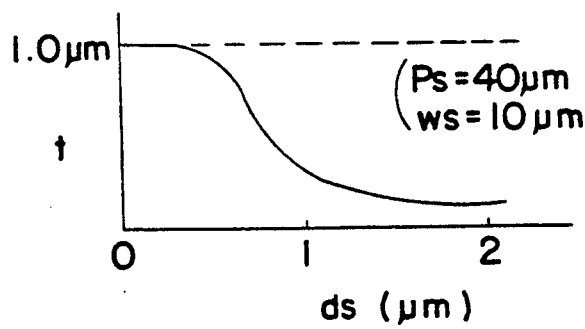

FIG. 3 shows a sectional side view of the substrate 10 having the epitaxially grown layer 11 thereon, shown in FIG. 2, in which Ps is the distance from the center of one striped channel 20 to that of the other striped channel 21 of the substrate 10, Ws is the width of each of the striped channels 20 and 21, ds is the depth of each of the striped channels 20 and 21, and t is the thickness of the central area 300 of the layer 11. FIGS. 4(A) to 4(C), respectively, show the effects of the channel distance Ps, the channel width Ws and the channel depth ds on the thickness t of the central area 300 of the epitaxially grown layer 11, wherein the thickness T of the surroundings 310 of the layer 11 was maintained to be a fixed value, 1.0 μm. FIGS. 4(A) to 4(C) indicate that the effect of the striped channels 20 and 21 on the suppression of the epitaxial growth rate of a crystal layer is gradually decreased with an increase in the channel distance Ps, that the suppression effect begins when the channel width Ws becomes about 4 μm and the maximum suppression effect is attained when the channel width Ws becomes about 15 μm, and that the suppression effect begins suddenly when the channel depth ds becomes 0.4 μm or more and the maximum suppression effect is attained when the channel depth ds becomes about 1.2 μm.

As mentioned above, the epitaxially grown layer 11 in which the thickness in the central area 300 is thinner than that in the surroundings 310 can be formed on the substrate 10 by liquid phase epitaxy. If the succeeding crystal layers are successively epitaxially grown on the layer 11, a multi-layered structure semiconductor device such as a semiconductor laser device is obtainable. When a second layer with a sufficiently great thickness is epitaxially grown on the crystal layer 11, the surface of the second layer becomes flat regardless of the above-mentioned ununiform thickness of the layer 11. When the thickness of the second layer on the crystal layer 11 is not great, the surface of the second layer becomes concave corresponding to the concaved area 300 of the surface of the layer 11. In both cases, since the surface of each of the central area 300 and the surroundings 310 of the layer 11 is flat, the thickness of the succeeding layer grown on the said layer 11 functioning as a base layer can be regulated with reproducibility.

EXAMPLE 2

Figure 5:
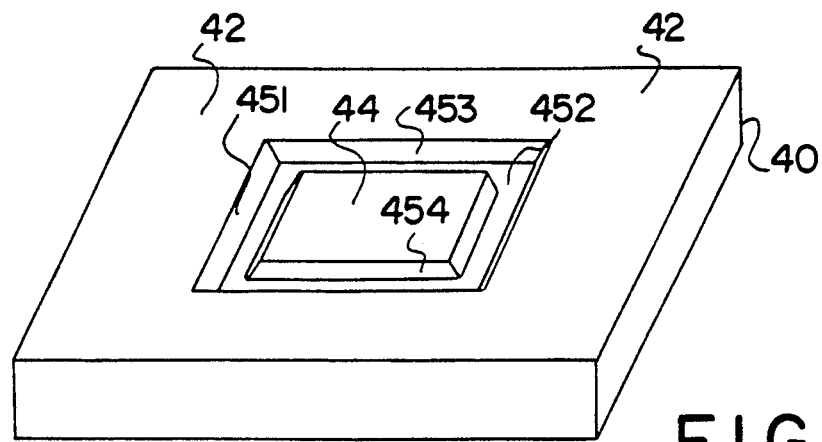
FIG. 5 is a perspective view showing another semiconductor substrate used for the epitaxial growth process of this invention.
Figure 6:
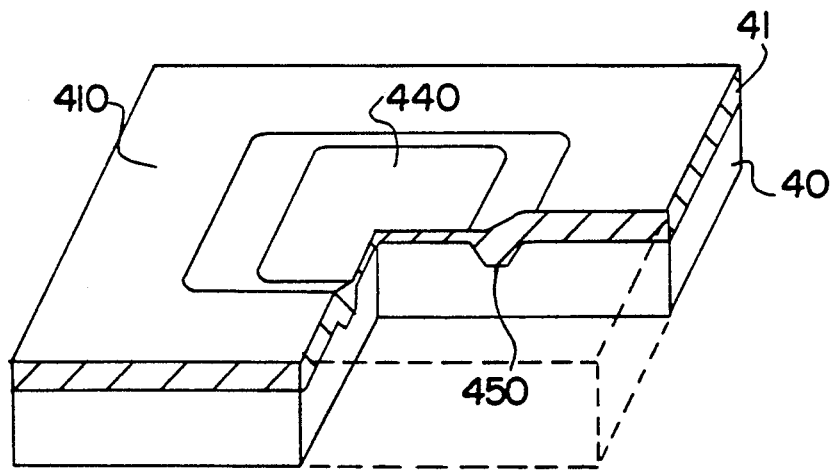
FIG. 6 is a perspective view showing the semiconductor substrate shown in FIG. 5 on which a crystal layer is epitaxially grown.

FIG. 5 shows another semiconductor substrate 40 for the epitaxial growth process of this invention, in which four striped channels 451, 452, 453 and 454, the facing channels of which are disposed in a parallel manner are formed on the substrate 40 by an etching technique. The width, the depth and the length of each of the striped channels 451, 452, 453 and 454 are, for example, 10 μm, 1 μm and 40μm, respectively. As shown in FIG. 6, when a crystal layer 41 is grown on the substrate 40 by liquid phase epitaxy, the thickness of the central area 440 of the crystal layer 41 corresponding to the central portion 44 of the substrate 40 surrounded by the four striped channels 451, 452, 453 and 454 becomes thinner than that of the surrounding area 410 of the crystal layer 41 corresponding to the surrounding portions 42 of the substrate 40 for the same reasons as mentioned in Example 1. In this example, the thicknesses of the central area 440 and the surrounding area 410 of the crystal layer 41 were 0.15 μm and 0.60 μm, respectively.

The thickness of the central area 440 of the crystal layer 41 can be, of course, regulated with reproducibility by changes in the widths and/or the depths of the striped channels 451, 452, 453 and 454, and/or the area of the central portion 44 of the substrate 40 for the same reasons as mentioned in Example 1.

EXAMPLE 3

This example provides a semiconductor laser device which comprises a substrate having a main striped channel for confining current therein and substriped channels formed in a parallel manner outside of said main striped channel; and a multi-crystal layer grown on the substrate by liquid phase epitaxy. The portions of the active layer for laser oscillation, which are positioned above the main striped channel of the substrate in the vicinity of the facets, are thinner than the portion of the active layer, which is positioned above the main striped channel of the substrate inside of the facets.

Figure 7:
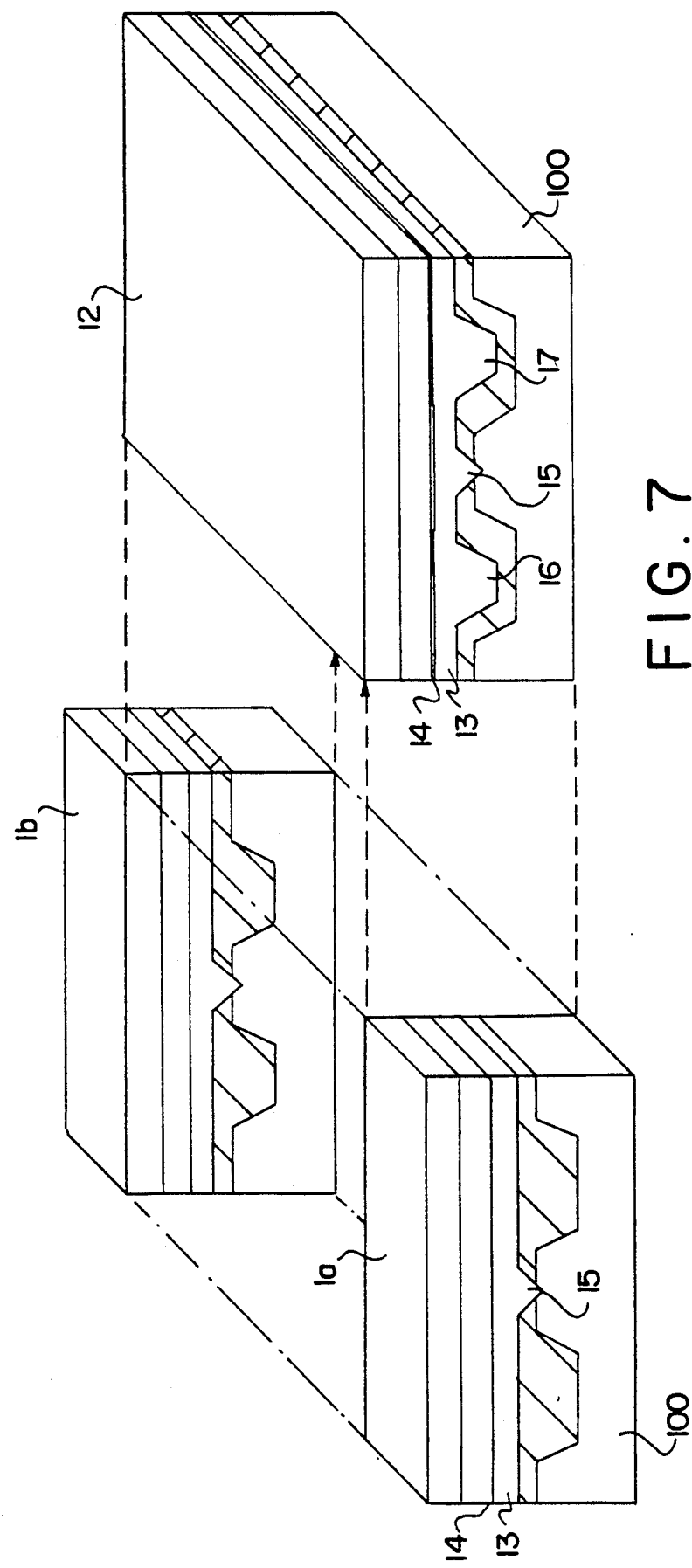
FIG. 7 is a perspective view showing a semiconductor laser device of this invention which is cut at the interface between each of the window regions and the light stimulated region.

FIG. 7 shows a VSIS (V-channeled substrate inner stripe) semiconductor laser device with an internal cavity length of 250 μm, which is composed of window regions 1a and 1b with lengths of 25 μm from the corresponding facets and the stimulated region 12 positioned between the window regions 1a and 1b. The thickness of each of the portions of the active layer 14 corresponding to the main striped channel 15 in the window regions 1a and 1b is thinner than that of the portion of the active layer 14 corresponding to the main striped channel 15 in the stimulated region 12. The difference in thickness between the portion of the active layer 14 in each of the window regions 1a and 1b and the portion of the active layer 14 in the stimulated region 12 is caused by the sub-striped channels 16 and 17 formed in a parallel manner outside of the main striped channel 15. This is based on the phenomenon that when the cladding layer 13 is grown on the substrate 100 by liquid phase epitaxy, As in the growth solution which comes into contact with the substriped channels 16 and 17 of the substrate 100 is more quickly consumed for the growth of the cladding layer 13 than that in the solution in the surroundings of the sub-striped channels 16 and 17, resulting in the diffusion of As from the solution in the surrounding portions of the substrate 100 into that in the substriped channels 16 and 17 of the substrate 100, causing a decrease in the concentration of As in the surroundings of the sub-striped channels 16 and 17. Thus, the growth rate of the cladding layer 13 in the surroundings of the sub-striped channels 16 and 17 of the substrate 100 is suppressed. Accordingly, the surface of the cladding layer 13 corresponding to the main striped channel 15 in the stimulated region 12 becomes concaved. The surface of the active layer 14 which is succeedingly grown on the resulting cladding layer 13 becomes flat, because the growth rate of the active layer 14 in the concaved portion of the cladding layer 13 is higher than that of the active layer 14 in the surroundings of the concaved portion of the cladding layer 13, so that the portion of the active layer 14 corresponding to the concaved portion of the cladding layer 13 becomes thicker than the other portions of the active layer 14. As a result, the thickness of each of the portions of the active layer 14 corresponding to the main striped channel 15 in the window regions 1a and 1b becomes thinner than that of the portion of the active layer 14 corresponding to the main striped channel 15 in the stimulated region 12.

When current is applied to the abovementioned semiconductor laser device, since the thickness of each of the portions of the active layer 14 for laser oscillation above the main striped channel 15 in the window regions 1a and 1b is thinner than that of the portion of the active layer 14 above the main striped channel 15 in the stimulated region 12, the injected electrons are excited up to a higher level of the conduction band than that of the conduction band of the stimulated region 12. Thus, this laser device functions as a window laser in which laser light oscillated in the stimulated region 12 is not absorbed at the window regions 1a and 1b, thereby allowing deterioration of the facets due to laser light to be suppressed and moreover attaining high output power operation.

Figure 8A:
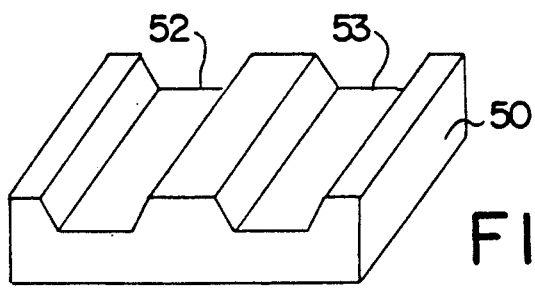
FIGS. 8(A) to 8(F) are schematic diagrams showing a production process of the semiconductor laser device shown in FIG. 7.
Figure 8B:
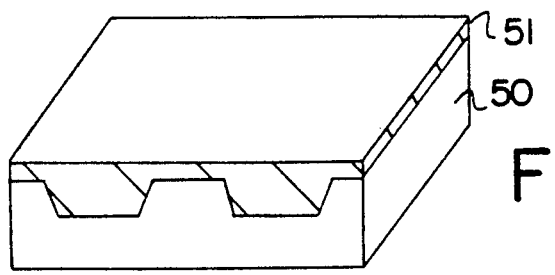
Figure 8C:
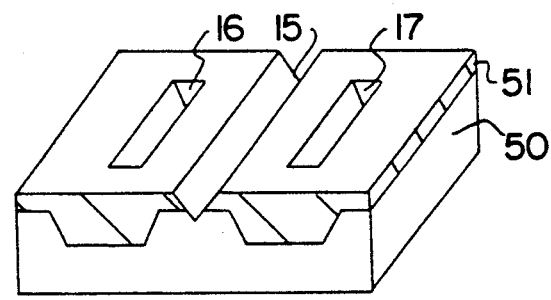

FIGS. 8(A) to 8(F) show a production process of the semiconductor laser device shown in FIG. 7. As shown in FIG. 8(A), on the portions of a p-GaAs substrate 50 corresponding to the sub-striped channels 16 and 17 to be formed in a parallel manner in the succeeding step, a pair of striped channels 52 and 53 are formed by an etching technique. Then, on the GaAs substrate 50, as shown in FIG. 8(B), an n-GaAs current blocking layer 51 is grown by liquid phase epitaxy in such a manner that the striped channels 52 and 53 are filled with the current blocking layer 51 having a flat surface, the thickness of which is 0.8 μm in the portion corresponding to the main striped channel 15 to be formed in the succeeding step. Then, as shown in FIG. 8(C), the sub-striped channels 16 and 17 having a width of 10 μm and a depth of 1 μm are formed on the current blocking layer 51 corresponding to the pair of striped channels 52 and 53 in the stimulated region 12, respectively, by an etching technique, and the main striped channel 15 having a width of 3 μm and a depth of 1 μm in the central portion between the sub-striped channels 16 and 17 by an etching technique in such a manner that it reaches the substrate 50, resulting in a current path therein. The sub-striped channels 16 and 17 do not constitute a current path since they do not contact the substrate 50 due to the current blocking layer 51. Thus, current flows through only the main striped channel 15, which serves to effectively confine the current therein thereby suppressing ineffective current which does not contribute to laser oscillation.

Figure 8D:
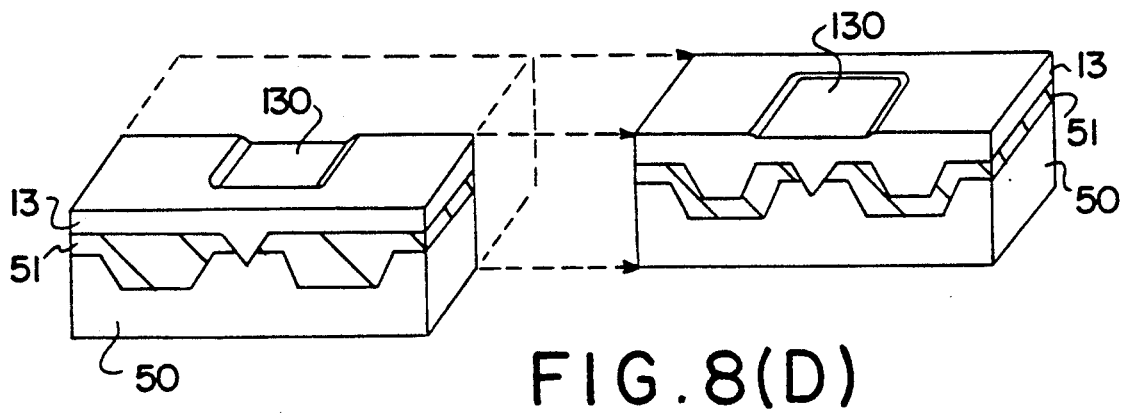
Figure 8E:
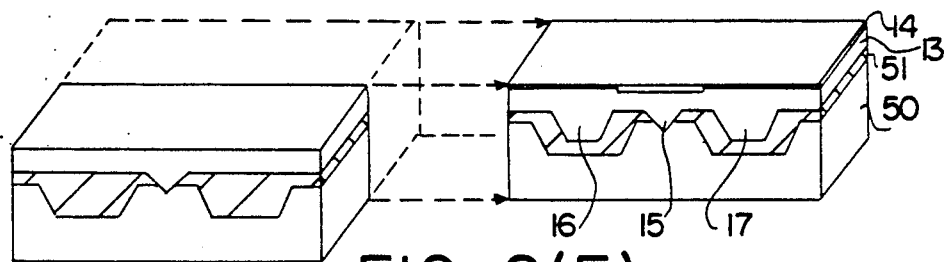
Figure 8F:
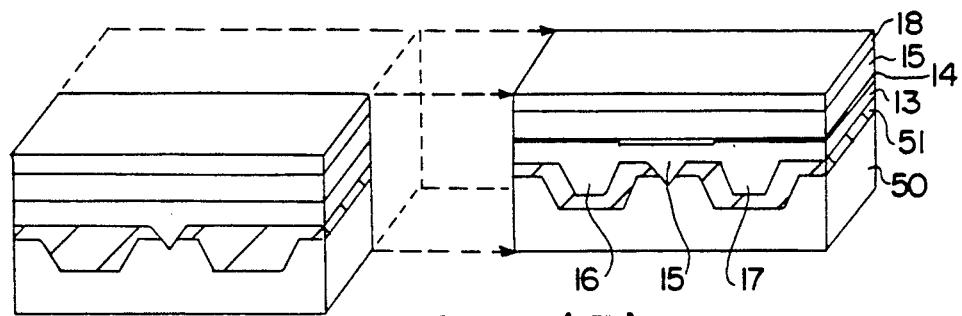

Thereafter, as shown in FIGS. 8(D), 8(E) and 8(F), on the current blocking layer 51 including the main striped channel 15 and the sub-striped channels 16 and 17, a p-GaAlAs cladding layer 13, a p-GaAlAs active layer 14, an n-GaAlAs cladding layer 15 and an n-GaAs cap layer 18 are successively grown by liquid phase epitaxy, resulting in a double-heterostructure multi-layered crystal for laser oscillation.

In the above-mentioned crystal growth process, the cladding layer 13 is grown such that the thickness of the portion of the cladding layer 13 above the main striped channel 15 positioned between the substriped channels 16 and 17 is thinner than that of the other portion of the cladding layer 13 due to the above-mentioned phenomenon, resulting in the concaved portion 130 on the surface of the cladding layer 13 corresponding to the main striped channel 15 in the stimulated region 12 as shown in FIG. 8(D). The surface of the active layer 14, which is succeedingly grown on the cladding layer 13 by liquid phase epitaxy, becomes flat over the whole surface of the cladding layer 13 including the above-mentioned concaved portion 130 due to the characteristics of liquid phase epitaxy, so that, as shown in FIG. 8(E), the thickness of the portion of the active layer 14 grown on the concaved portion 130 of the cladding layer 13 becomes thicker than that of the portion of the active layer 14 grown on the other portion of the cladding layer 13. Thus, the thickness of the portion of the active layer 14 corresponding to the main striped channel 15, which contributes to laser light oscillation, in the stimulated region 12 is thicker than that of the portion of the active layer 14 corresponding to the main striped channel 15 in each of the window regions 1a and 1b.

In this example, the thickness of the active layer 14 corresponding to the main striped channel 15 in the stimulated region 12 was 0.08 μm, and that of the active layer 14 corresponding to the main striped channel 15 in each of the window regions 1a and 1b was 0.03 μm, resulting in a window semiconductor laser device which suppressed the absorption of laser light in the window regions and created a high output power of 200 mV at the highest in continuous laser oscillation at room temperature.

This example disclosed the crystal growth on a p-GaAs substrate alone, but it is not limited thereto. An n-GaAs semiconductor substrate can be used. As the semiconductor material, an InGaAsP system, an AlGaAsSb system, etc., can, of course, be used.

EXAMPLE 4

Figure 9:
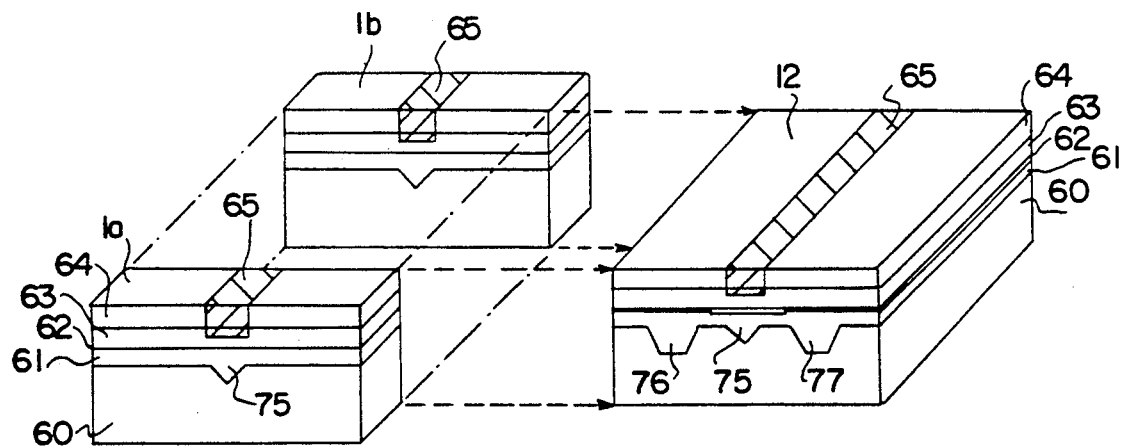
FIG. 9 is a perspective view showing another semiconductor laster device of this invention which is cut at the interface between each of the window regions and the light stimulated region.

FIG. 9 shows another semiconductor laser device of this invention, which is produced in the same manner as that in Example 3 except that a striped structure is formed in the cap layer 64. This laser device is produced as follows: The striped channels 75, 76 and 77 are formed on the p-substrate 60 in the same manner as in Example 3, and then a p-cladding layer 61, a p-active layer 62, an n-cladding layer 63 and a p-cap layer (or a high ohmic contact) 64 are successively formed by liquid phase epitaxy, followed by diffusing n-impurities into the region of the p-cap layer 64 corresponding to the main striped channel 75 to form an n-current path 65. The thickness of the active layer 62 above the main striped channel 75 in each of the window regions 1a and 1b is thinner than that of the active layer 62 above the main striped channel 75 in the stimulated region 12. The main striped channel 75 of this example allows for the formation of an index guided waveguide in the active layer 62.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An epitaxial growth process the production of a semiconductor laser device comprising forming striped channels having a width of 10 microns and a depth of 1 micron facing each other at an interval of 40 microns in parallel on the growth surface of a substrate by etching and growing a crystal layer on the substrate by liquid phase epitaxy, and controlling the growth rate of that portion of the crystal layer which is positioned between or surrounded by said striped channels so that the portion of the crystal layer is substantially flat and a portion of the epitaxially growing layer between and surrounded by the striped channels is thinner than the portions of the epitaxially grown layer in the other areas than between the striped channels.

* * * * *